US009966405B2

(12) United States Patent
Hsu et al.

(10) Patent No.: US 9,966,405 B2
(45) Date of Patent: May 8, 2018

(54) METHOD AND APPARATUS FOR IMAGE SENSOR PACKAGING

(71) Applicant: Taiwan Semiconductor Manufacturing Company, Ltd., Hsin-Chu (TW)

(72) Inventors: Tzu-Hsuan Hsu, Kaohsiung (TW); Dun-Nian Yaung, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 201 days.

(21) Appl. No.: 15/132,068

(22) Filed: Apr. 18, 2016

(65) Prior Publication Data

US 2016/0233261 A1    Aug. 11, 2016

Related U.S. Application Data

(62) Division of application No. 13/935,755, filed on Jul. 5, 2013, now Pat. No. 9,318,640.

(Continued)

(51) Int. Cl.
*H01L 27/14* (2006.01)
*H01L 27/146* (2006.01)
*H01L 31/18* (2006.01)

(52) U.S. Cl.
CPC ...... *H01L 27/14634* (2013.01); *H01L 27/146* (2013.01); *H01L 27/1464* (2013.01); *H01L 27/1469* (2013.01); *H01L 27/14627* (2013.01); *H01L 27/14636* (2013.01); *H01L 27/14645* (2013.01); *H01L 27/14689* (2013.01); *H01L 31/18* (2013.01); *H01L 27/14621* (2013.01)

(58) Field of Classification Search
CPC ......... H01L 27/14634; H01L 27/14645; H01L 27/1464; H01L 27/14636; H01L 27/14689; H01L 27/1469; H01L 27/14627; H01L 27/146; H01L 31/18; H01L 27/14621
See application file for complete search history.

(56) References Cited

U.S. PATENT DOCUMENTS 8,618,659 B2    12/2013 Sato et al.
8,928,041 B2 *   1/2015 Shimotsusa ....... H01L 27/14609
                                                        257/225
(Continued)

FOREIGN PATENT DOCUMENTS

JP    2000150846 A    5/2000
JP    2006287640 A    10/2006
(Continued)

*Primary Examiner* — Tony Ko
(74) *Attorney, Agent, or Firm* — Slater Matsil, LLP

(57) ABSTRACT

A device having a sensor die with a sensor and a control circuit die with at least one control circuit disposed therein, the control circuit die on the sensor die. A plurality of mounting pads is disposed on a second side of the sensor die. A first electrical connection connects a first one of the plurality of mounting pads to a first control circuit of the at least one sensor control circuit and a second electrical connection connects the first control circuit to the sensor. A third electrical connection connects the sensor to a second control circuit of the at least one control circuit and a fourth electrical connection connects the second control circuit to second one of the plurality of mounting pads.

20 Claims, 14 Drawing Sheets

Related U.S. Application Data

(60) Provisional application No. 61/789,092, filed on Mar. 15, 2013.

(56) References Cited

U.S. PATENT DOCUMENTS

| | | |
|---|---|---|
| 9,153,490 B2 * | 10/2015 | Mitsuhashi ....... H01L 27/14645 |
| 2009/0078973 A1 | 3/2009 | Hsu et al. |
| 2009/0286346 A1 | 11/2009 | Adkisson et al. |
| 2010/0248412 A1 | 9/2010 | Guidash |
| 2011/0049336 A1 | 3/2011 | Matsunuma |
| 2011/0102657 A1 | 5/2011 | Takahashi et al. |
| 2012/0057056 A1 | 3/2012 | Oike |
| 2013/0284885 A1 | 10/2013 | Chen et al. |
| 2013/0334638 A1 | 12/2013 | Chen et al. |

FOREIGN PATENT DOCUMENTS

| | | |
|---|---|---|
| JP | 2007173861 A | 7/2007 |
| JP | 2012054876 A | 3/2012 |
| KR | 20110014986 A | 2/2011 |

* cited by examiner

METHOD AND APPARATUS FOR IMAGE SENSOR PACKAGING

CROSS REFERENCE TO RELATED APPLICATION

This application is a divisional of U.S. patent application Ser. No. 13/935,755, filed on Jul. 5, 2013, and entitled "Method and Apparatus for Image Sensor Packaging" which claims priority to U.S. Provisional Patent Application No. 61/789,092, filed on Mar. 15, 2013, and entitled "Method and Apparatus for Image Sensor Packaging" which applications are incorporated herein by reference.

BACKGROUND

A Metal-oxide semiconductor (MOS) image sensor typically comprises an array of picture elements (pixels), which utilizes light-sensitive MOS circuitry to convert photons into electrons. The light-sensitive MOS circuitry typically comprises a photodiode formed in a silicon substrate. As the photodiode is exposed to light, an electrical charge is induced in the photodiode. Each sensor, or pixel, may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or other circuitry.

A MOS image sensor, or simply a MOS sensor, may have a front side where a plurality of dielectric layers and interconnect layers are located connecting the photodiode in the substrate to peripheral circuitry, and a backside having the substrate. A MOS sensor is a front-side illuminated (FSI) image sensor if the light is from the front side of the sensor; otherwise it is a back-side illuminated (BSI) sensor with light incident on the backside. For a BSI sensor, light can hit the photodiode through a direct path without the obstructions from the dielectric layers and interconnects located at the front side, which helps to increase the number of photons converted into electrons, and makes the MOS sensor more sensitive to the light source.

Three-dimensional (3D) integrated circuits (ICs) may be used to achieve a high density required for current applications, such as image sensor applications. When a MOS sensor is packaged in a 3D IC, challenges arise in creating reduced area 3D IC image sensors. Therefore there is a need for methods and systems to reduce the package area for MOS sensors related ASICs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
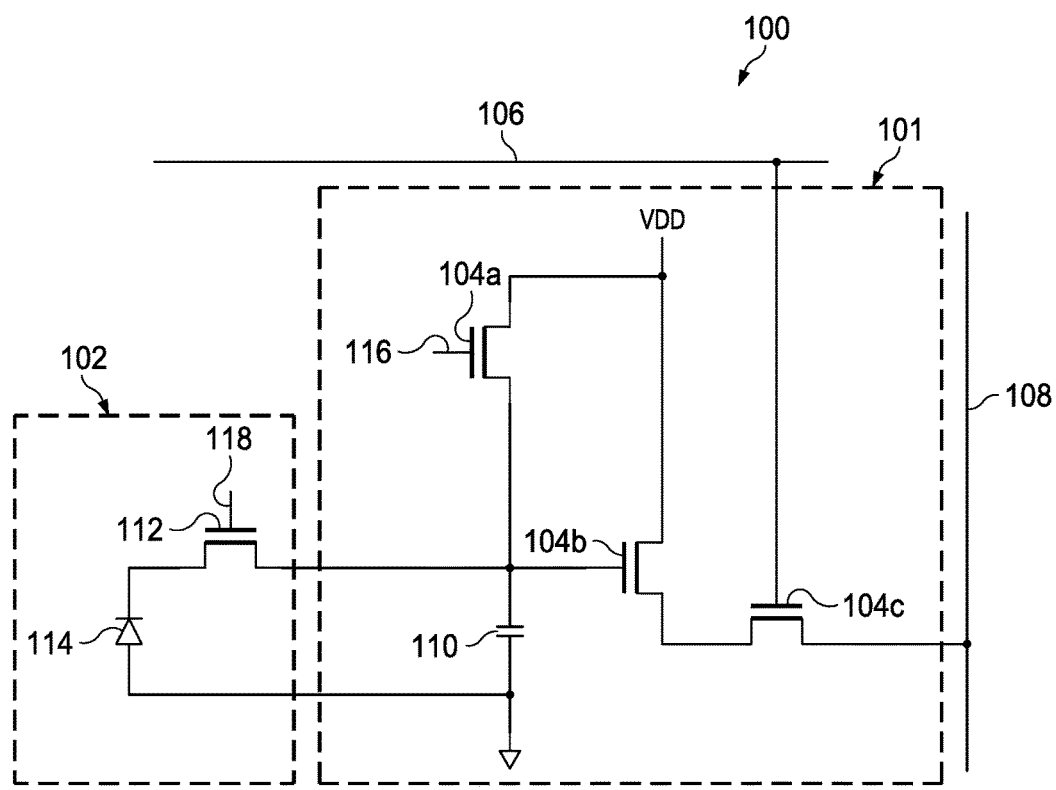
FIG. 1 is a circuit diagram illustrating an embodiment of a circuit for controlling and reading a MOS sensor pixel.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an image sensor with related control circuitry. The embodiments of the disclosure may also be applied, however, to a variety of image sensors and semiconductor devices. Hereinafter, various embodiments will be explained in detail with reference to the accompanying drawings.

Image sensors generally use control circuitry in order to access each individual pixel in sequence. To reduce the number of connections required to address all pixels in a large array of pixels, individual pixels may be read in multiplexed fashion, with a circuit controlling which row of a pixel array is addressed and separate circuitry controlling which column of a pixel array is addressed. Thus, a single pixel at an activated row and column may be read. Addressing each pixel in sequence permits the control circuitry to assemble a graphic image using data collected from individual pixels.

One parameter affecting the performance of a pixel array is the fill factor, or area of a particular sensor occupied by each individual pixel. Larger pixels permit greater light sensitivity, and consequently, greater image quality. However, larger image sensor dies result in increased cost. Larger pixels in a smaller die gives a greater fill factor and results in greater performance-per-area. One embodiment of the presented disclosure includes moving the circuitry controlling the pixels to a separate die, e.g., a separate ASIC die that may be mounted on the front, non-illuminated side of the sensor die. While the sensors forming the pixel array may be described as being complimentary metal oxide semiconductor elements, the pixel array may be comprised of charge coupled devices (CCDs) or any other photosensitive element. Additionally, while the term CMOS generally refers to a circuit having both p-type and n-type elements, embodiments of the disclosure may have pixel arrays with elements comprising a single conductivity type, namely, all p-type (PMOS) or all n-type (NMOS) elements. The use of complimentary conductive types in forming the elements of a sensor array and associated circuits provides greater efficiency in the control circuit. Moving the readout and control circuits to a separate ASIC wafer permits the use of both p-type and n-type elements in the control circuits themselves while still permitting the pixel array to be formed from elements of a single or a same conductivity type on the sensor wafer. Thus, all of the transistors on a sensor die may be NMOS device, or all transistors on a sensor die may be PMOS devices.

FIG. 1 is a circuit diagram illustrating a MOS sensor pixel 100 circuit comprising a sensor 102 and pixel control circuit 101. The pixel 100 in a first wafer may be further connected to a readout and control circuit (not shown) in a second wafer. More particularly, circuits in a first wafer are electrically coupled to readout control circuits in the second wafer by stacking the second wafer on top of the first wafer and bonding two wafers together through a plurality of interconnects such as bonding pads. The detailed description of the stacked die structure will be discussed below with respect to subsequent figures.

The pixel 100 comprises a photodiode 114 and a transfer transistor 112 connected in series. In particular, the photodiode 114 may act as a source in the transfer transistor 112, with the gate of the transfer transistor 112 permitting electrons from the photodiode 114 to flow through the transfer transistor 112 when activated. In an embodiment, the transfer transistor 112 and has a gate coupled to a transfer line 118.

In an embodiment, the pixel control circuit 101 comprises a reset transistor 104a, a source follower 104b and a select transistor 104c. The drain of the transfer transistor 112 is coupled to a source of the reset transistor 104a and a gate of the source follower 104b. The reset transistor 104a has a gate coupled to a reset line 116. A drain of the reset transistor 104a is coupled to a voltage source VDD. The reset transistor 104a is used to preset the voltage at the gate of the source follower 104b. A drain of the source follower 104b is coupled to the voltage source VDD, and a source of the source follower 104b is coupled to the drain of the select transistor 104c. The source follower 104b provides a high impedance output for the pixel 100. A gate of the select transistor 104c is coupled to a row select line 106. A source of the select transistor 104c is coupled to an output line 108, which is coupled to a readout control circuit (not shown).

In operation, light strikes the photosensitive region of the photodiode 114. As a consequence, the photodiode 114 generates an electrical charge proportional to the intensity or brightness of light. The electrical charge is transferred by enabling the transfer transistor 112 through a transfer signal applied to the gate of the transfer transistor 112. The electrical charge transferred from the photodiode 114 by the transfer transistor 112 enables the source follower transistor 104b, thereby allowing an electrical charge proportional to the charge generated by the photodiode 114 to pass from the voltage source VDD through the source follower 104b to the select transistor 104c. When sampling is desired, the row select line 106 is enabled, allowing the electrical charge to flow through the select transistor 104c to the data process circuits (not shown) coupled to the output of the select transistor 104c.

It should be noted that FIG. 1 illustrates a schematic diagram of a single pixel 100 in an image sensor. The schematic diagram of the pixel 100 illustrated in FIG. 1 may be duplicated and circuitry may be added to provide a pixel array with multiple pixels. It should further be noted while FIG. 1 illustrates a pixel in a four-transistor structure. A person skilled in art will recognize that the four-transistor diagram is merely an example, which should not unduly limit the scope of the claims. One of ordinary skill in the art would recognize many variations, alternatives, and modifications. For example, various embodiments may include but not limited to a three-transistor pixel, a five-transistor pixel, a charge couple device (CCD) sensor, and the like.

Figure 2:
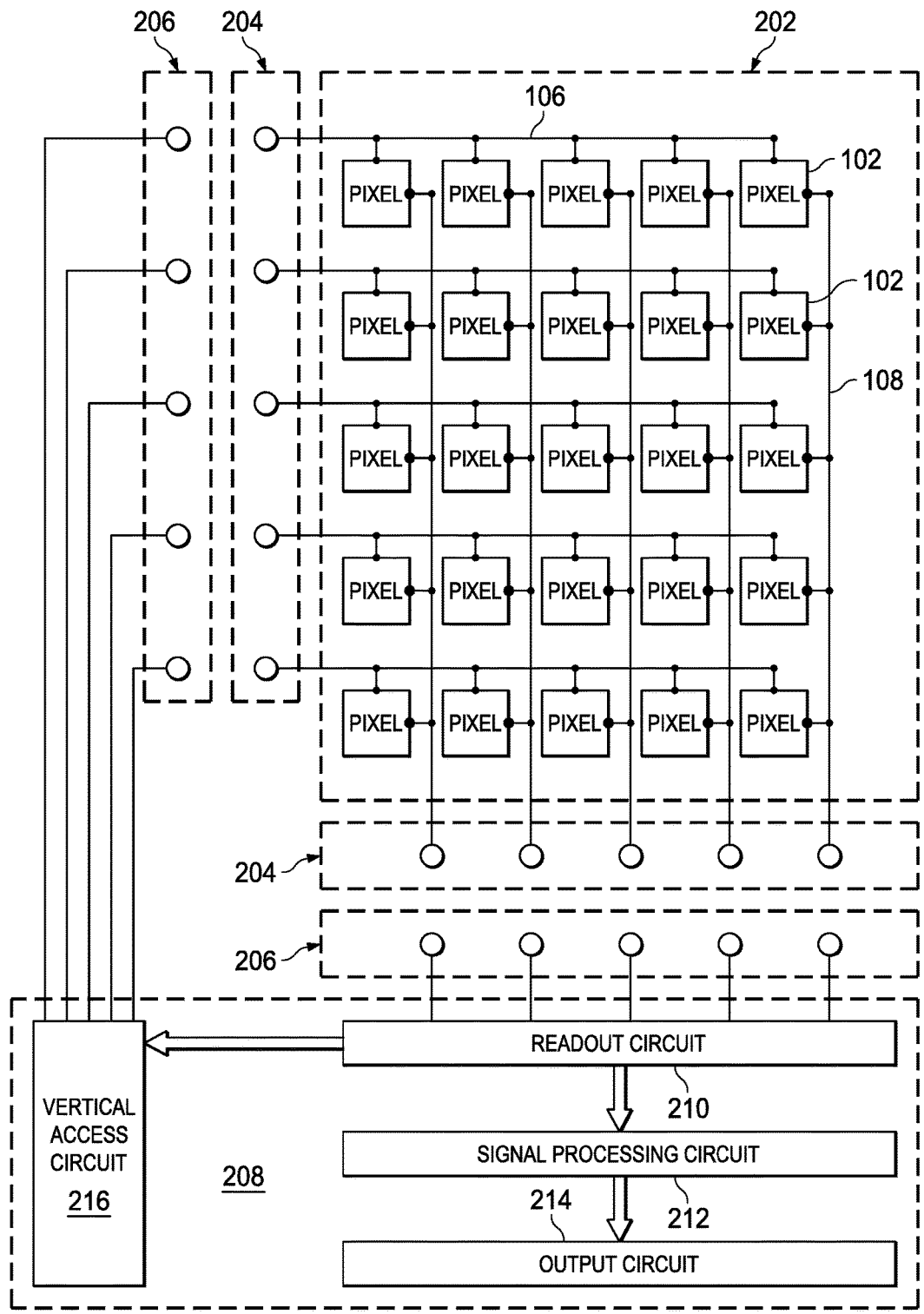
FIG. 2 is a logical diagram illustrating a pixel array and associated circuitry.

FIG. 2 is a logical diagram illustrating an array of pixels 100 and associated circuitry. A sensor 202 may comprise a plurality of pixels 100 or sensor elements, such as the pixel 100 illustrated in FIG. 1. In an embodiment, the pixels 100 may be arranged to form a two dimensional pixel array. The illustrated sensor 202 depicts a pixel array of size 5*5 by way of simplified example Skilled practitioners will readily recognize that the presented embodiments may be applied to any size of pixel array without deviating from the embodied principles. The sensor 202 may also comprise the associated connection lines such as the row select lines 106 and output lines 108. For example, each column of pixels 100 may share an interconnection or an output line 108 connected to one sensor bond pad 204 to transfer pixel outputs to the sensor bond pad 204. Thus, a value of a pixel 100 may be read from the output line 108 when a row of pixels 100 is activated by way of a row select line 106, with the output value coming from the pixel 100 in the column intersecting the activated row. Additionally, while not shown, reset lines 116, transfer lines 118 and like may also be connected to sensor bond pads 204.

In an embodiment, the control circuit 208 may comprise a readout circuit 210 to read the signals from the pixel 100 array. The readout signals will be processed by a signal processing circuit 212. The processed signals are used to generate the output for the image sensor application by an output circuit 214. Other circuits such as a vertical access circuit 216 may be part of the control circuit 208 as well. In an embodiment, the vertical access circuit 216 may apply a voltage to one of the row select lines 106 to activate a row of pixels 100 so that the pixel value may be read on the output line 108. The control circuit 208 may have one or more control circuit bond pads 206 configured to contact the sensor bond pads 204 such that when a control circuit die is mounted on a sensor die, the circuits in the control circuit 208 can read or receive signals from pixel 100 elements in the sensor 202.

The location of the individual control circuit elements is not limited to a particular die. In another embodiment, one or more control elements are disposed in the sensor die. For example, in such an embodiment, the readout circuit 210 may be disposed in the sensor die, and the sensor bond pads 204 and control circuit bond pads 206 disposed between the readout circuit 210 and the signal processing circuit 212. In an embodiment, the vertical access circuit 216 may be disposed on the sensor die 300, and the sensor bond pads 204 and control circuit bond pads 206 disposed between the vertical access circuit 216 and the control circuit die.

Figure 3A:
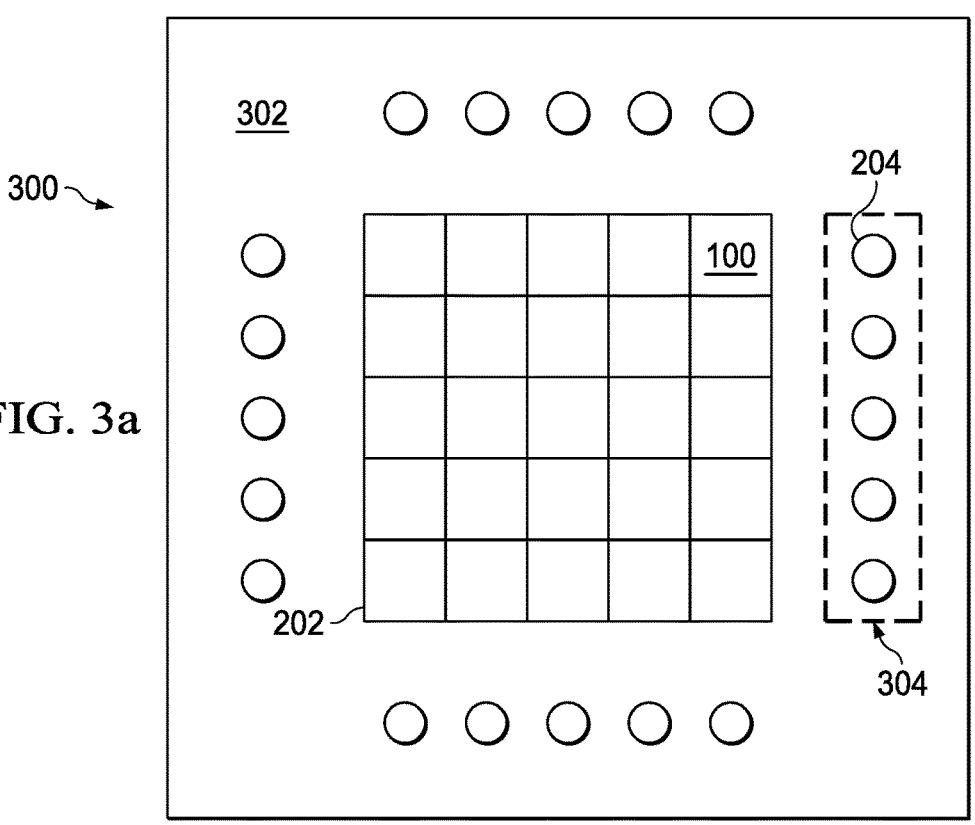
FIGS. 3*a*-4*b* illustrate embodiments of layouts of a sensor and bonding pads on a sensor die.

FIG. 3a illustrates embodiments of a layout of a sensor 202 and sensor bond pads 204 on a sensor die 300. The sensor die 300 may have one or more sensor bond pads 204 and a sensor substrate 302 with a sensor 202 having a plurality of pixels 100. The pixels 100 of the sensor 202 may be disposed within the substrate, such as under one or more metal layers, intermetal dielectrics (IMDs), interlevel dielectrics (ILDs), or the like. A redistribution layer (RDL) having one or more metal features may be formed to permit routing of connections between individual pixels 100 and sensor bond pads 204.

In an embodiment, the sensor bond pads 204 may be disposed outside of, or around, the sensor 202, without being aligned over the sensor 202. For example, a plurality of sensor bond pads 204 may be arranged into sensor bond pad rows 304 with all sensor bond pads 204 disposed outside of the sensor 202. In an embodiment, the sensor bond pads 204 may have a pitch that is about 1.0, about 2.0 or about 3.0 times the pitch of the pixel 100 pitch. The sensor bond pad groups 304 may be disposed along each of four sides of a rectangular, square, or otherwise four-sided sensor.

In an embodiment, the sensor bond pads 204 may each be connected to an output line 108 (See FIG. 1) or to a row select line 106 (See FIG. 1), so that the readout circuit 210 (See FIG. 2) or vertical access circuit 216 (See FIG. 2) may allow the control circuit to read data from individual pixels 100. Additionally, the sensor bond pads 204 may have a common connection to one or more reset transistors 104a in the pixels 100 to permit resetting a portion of, or the entire, sensor 202. The row select lines 106 and output lines 108 may extend from within an area over the sensor 202 outside the sensor 202 to electrically connect with a sensor bond pad 204.

The sensor die 300 may also have dummy bond pads (not shown), arranged within a sensor bond pad row 304, or disposed separately from the sensor bond pads 204. In an embodi, the dummy bond pads may provide additional bonding points for mounting a control circuit die. Alternatively, the sensor bond pads 204 may be dummy bond pads when the sensor bond pads 204 has no electrical connection to any component on the sensor die 300.

Figure 3B:
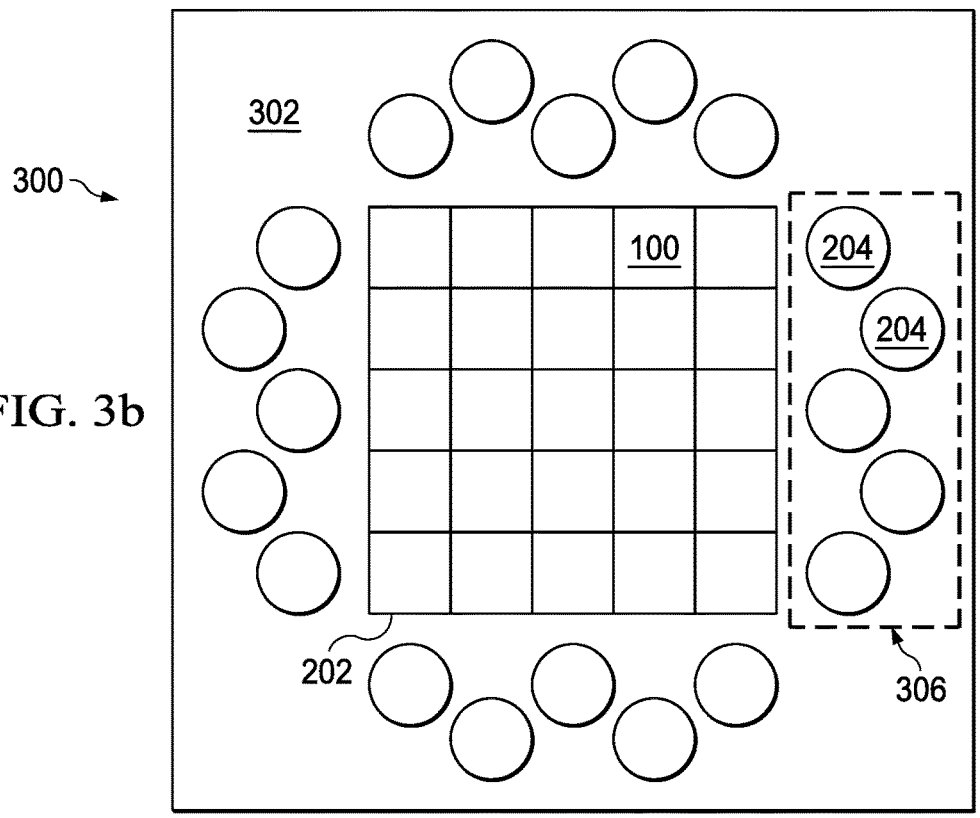

FIG. 3b illustrates another arrangement of the sensor bond pads 204 on the sensor die 300 in accordance with an embodiment. The sensor bond pads 204 in such an embodiment may have a bond pitch about 2 times the pitch of the pixels 100 in the sensor 202. The sensor bond pads 204 may be arranged in a sensor bond pad group 306 with all sensor bond pads 204 disposed outside of the sensor 202 region and in multiple offset rows avoiding overlapping of the sensor bond pads 204.

Figure 4A:
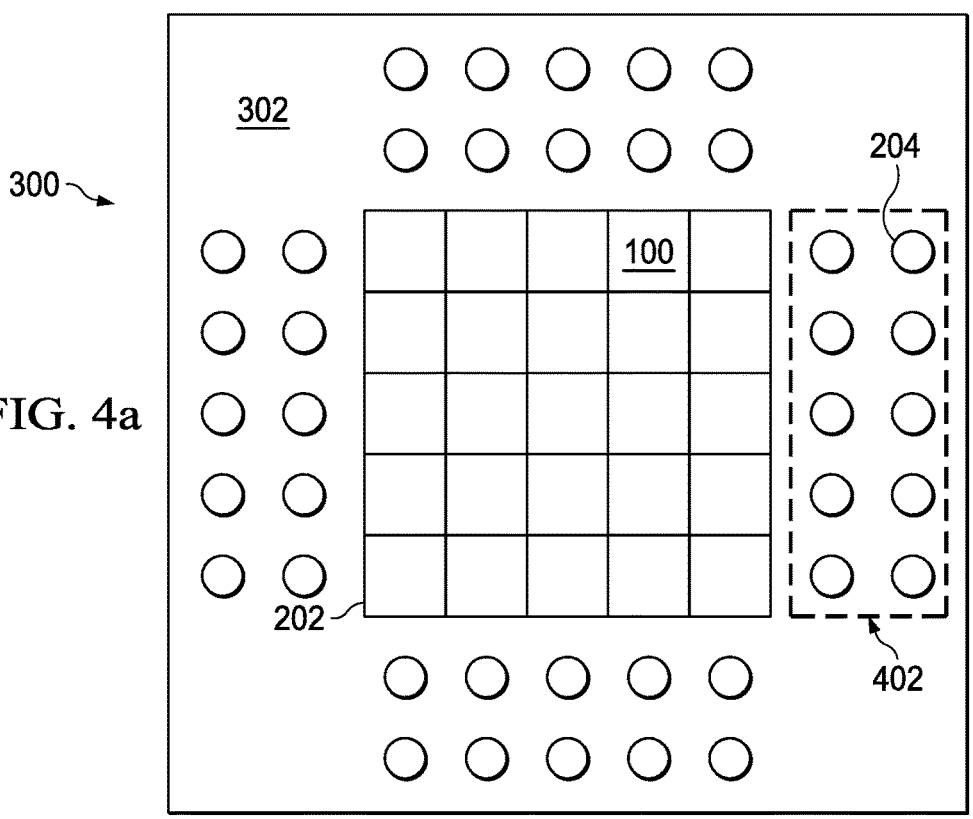

FIG. 4a illustrates another arrangement of the sensor bond pads 204 on the sensor die 300 in accordance with an embodiment. The sensor bond pads 204 in such an embodiment may have a bond pitch about the same as the pitch of the pixels 100 in the sensor 202. The sensor bond pads 204 may be arranged in sensor bond pad groups 402 in multiple rows with all sensor bond pads 204 disposed outside of the sensor 202. The sensor bond pad group 402 may, in an embodiment, have sensor bond pads 204 in a regular grid, with sensor bond pads 204 in a first row aligned with a second row.

Figure 4B:
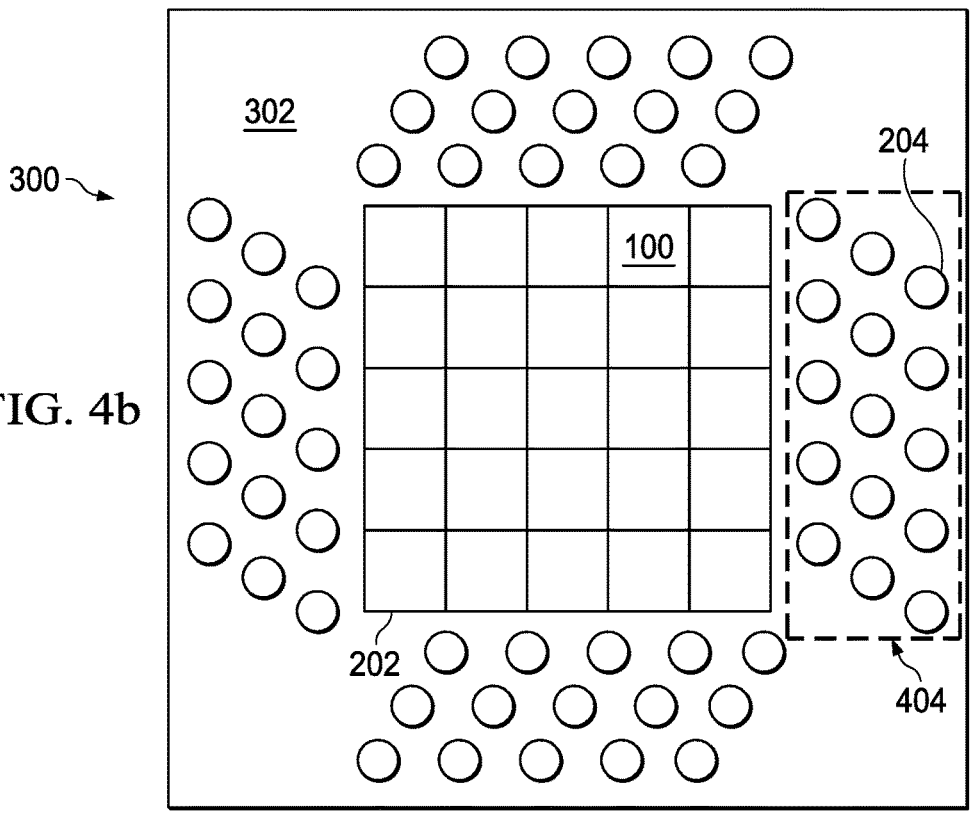

FIG. 4b illustrates another arrangement of the sensor bond pads 204 on the sensor die 300 in accordance with an embodiment. The sensor bond pads 204 in such an embodiment may have a bond pitch about the same as the pitch of the pixels 100 in the sensor 202. The sensor bond pads 204 may be arranged in a sensor bond pad group 404 in multiple rows, with all sensor bond pads 204 disposed outside of the sensor 202. In such an embodiment, adjacent rows may be offset, providing greater packing between round sensor bond pads in particular.

The aforementioned sensor bond pad 204 arrangements disclosed herein are intended to be exemplary and are not limiting. Other sensor bond pad 204 arrangements are possible without deviating from the presented disclosure.

Figure 5:
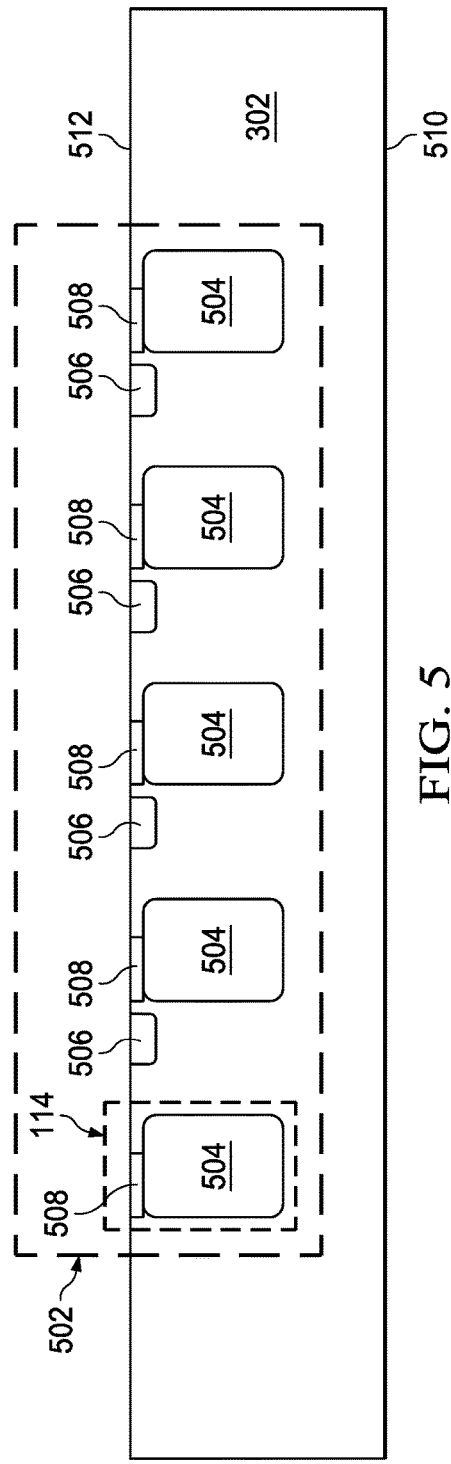
FIGS. 5-10 are cross-sectional views of an image sensor device in intermediate steps of production according to an embodiment.

FIGS. 5-10 are cross-sectional view of an image sensor device in intermediate steps of production according to an embodiment. Referring first to FIG. 5 there is shown a sensor die substrate having a sensor region 502 defined therein. The sensor die substrate 302 may be a wafer, die, or the like. The sensor region 502 may include one or more photosensitive regions 504 corresponding to the pixels 100. A photodiode 114 may be comprised of a photosensitive region 504 a surface layer 508 implanted. A drain 506 may also be implanted for each pixel 100, with the drain 506 and photodiode acting as the drain and source regions for a transistor described in greater detail below.

Figure 6:
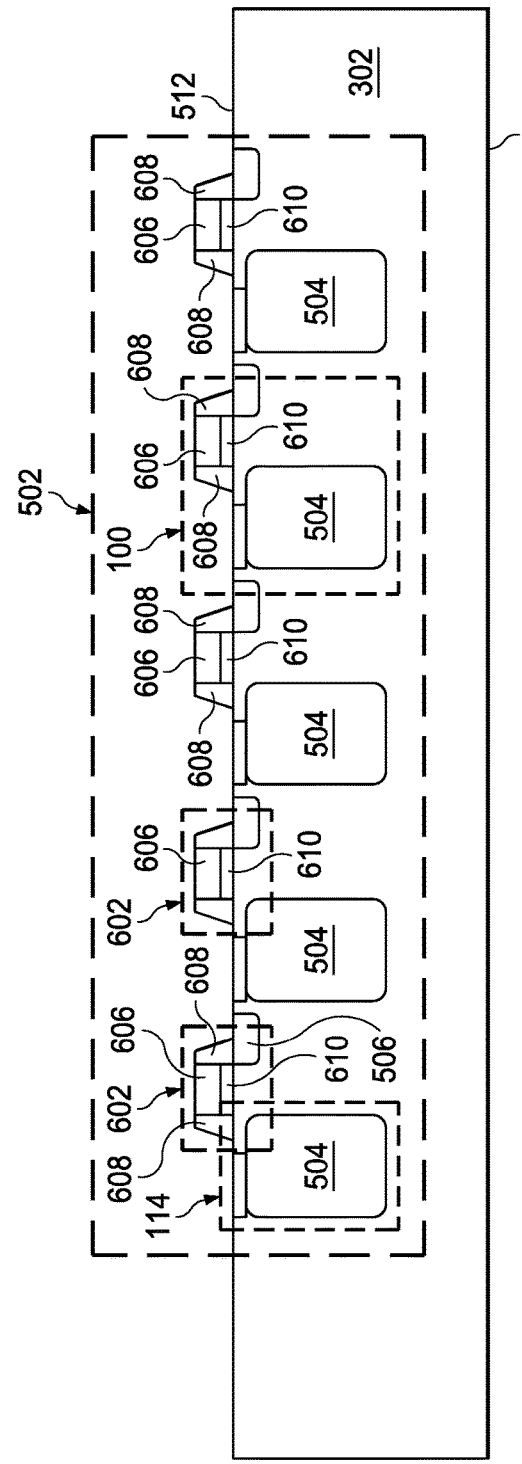

FIG. 6 is a cross-sectional view illustrating formation of a transfer gate 602 for an image sensor device according to an embodiment. The transfer gate 602 may span the drain region 506 and photodiode 114 to form the pixel. The transfer gate 602 may comprise an insulating layer 610 and a gate contact 606. In an embodiment, the transfer gate 602 may also comprise gate spacers 608. Additional sensor control circuit transistors and interconnections may also be formed on the sensor die substrate 302 and connected to individual pixels 100.

Figure 7:
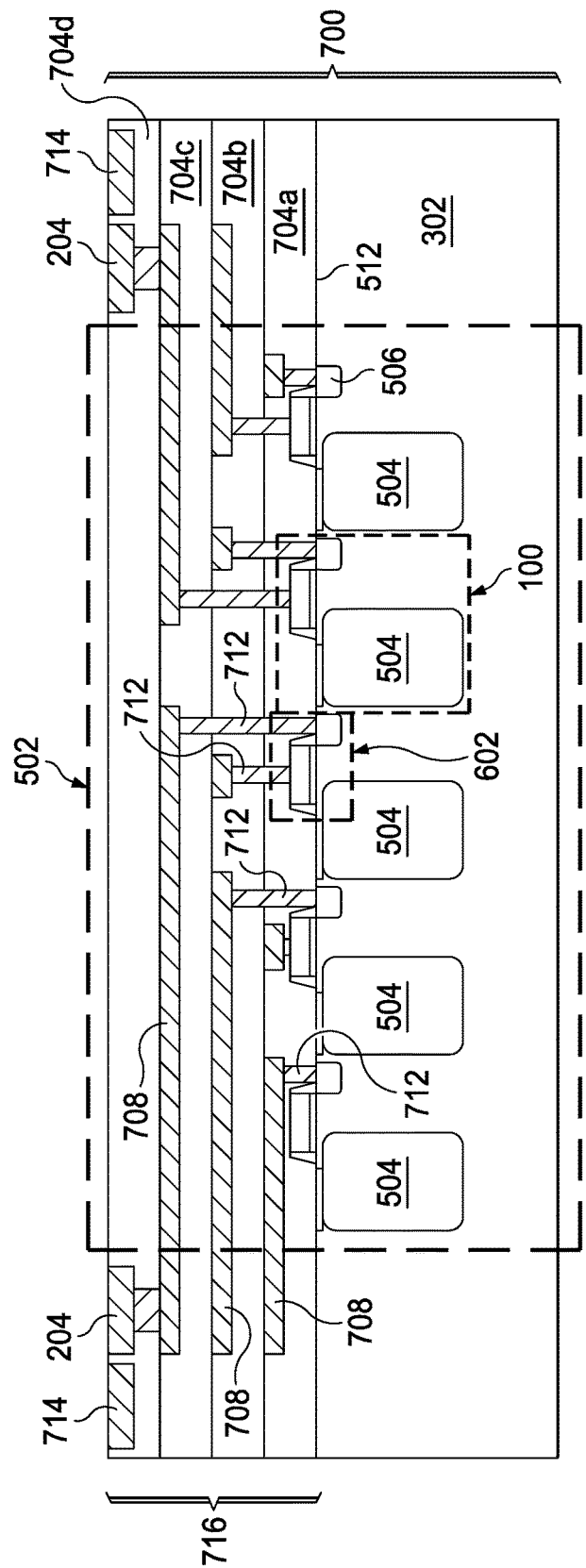

FIG. 7 is a cross-sectional view illustrating formation of one or more redistribution layers (RDLs) 716 and sensor bond pads 204 according to an embodiment. A sensor die 700 may have RDLs 716 formed on the frontside of the sensor die substrate 302. The RDLs 716 may comprised one or more dielectric layers 704a, 704b, 704c, 704d with conductive lines 708 and vias 712 disposed in a dielectric material to form the dielectric layers 704a, 704b, 704c, 704d and connect elements from a pixel 100 to a bond pad 204. The bond pads 204 may be formed in the uppermost dielectric layer 704d, with a top surface of the bond pads 204 exposed through the top surface of the dielectric layer 704d. Additionally, package bond pads 714 may also be formed in the uppermost dielectric layer 704d allowing for subsequent formation of package interconnects (not shown). The sensor bond pads 204 and package bond pads 714 may be formed outside the sensor region 502.

Figure 8:
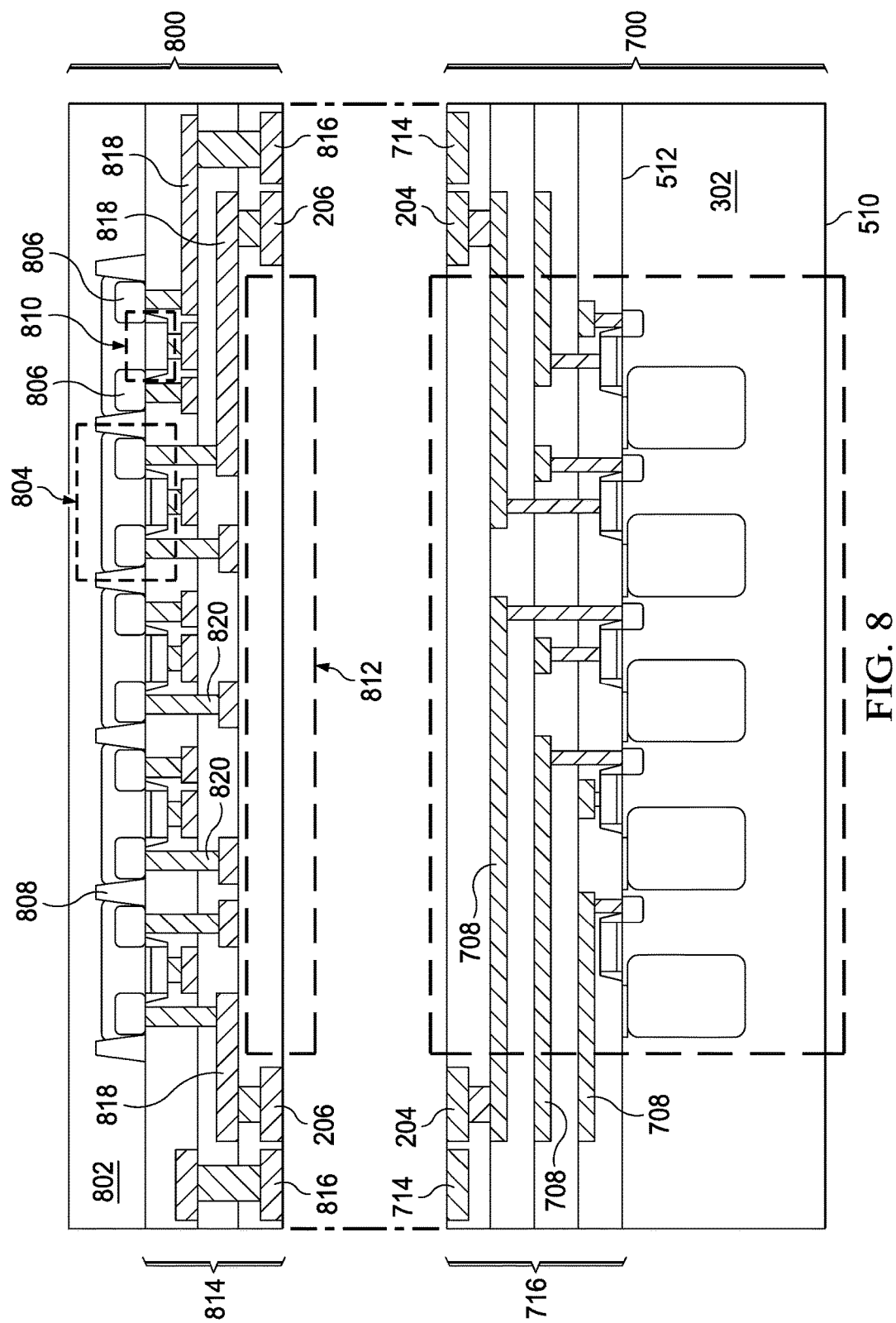

FIG. 8 is a cross-sectional view illustrating a sensor die 700 and a control circuit die 800. The control circuit die 800 may have one or more control circuit transistors 804 disposed in a control circuit die substrate 802. A control circuit transistor 804 may comprise source and drain regions 806 and gate 810. In an embodiment, shallow trench isolation (STI) structures 808 may be disposed between adjacent control circuit transistors 804 to isolate each control circuit transistor 804 from adjacent elements. Additionally, the control circuit die 800 may comprise one or more RDLs, such as RDL 814 having metal lines 818 and vias 820 connecting the control circuit bond pads 206 and 816 to elements of the control circuit transistors 804.

Figure 9:
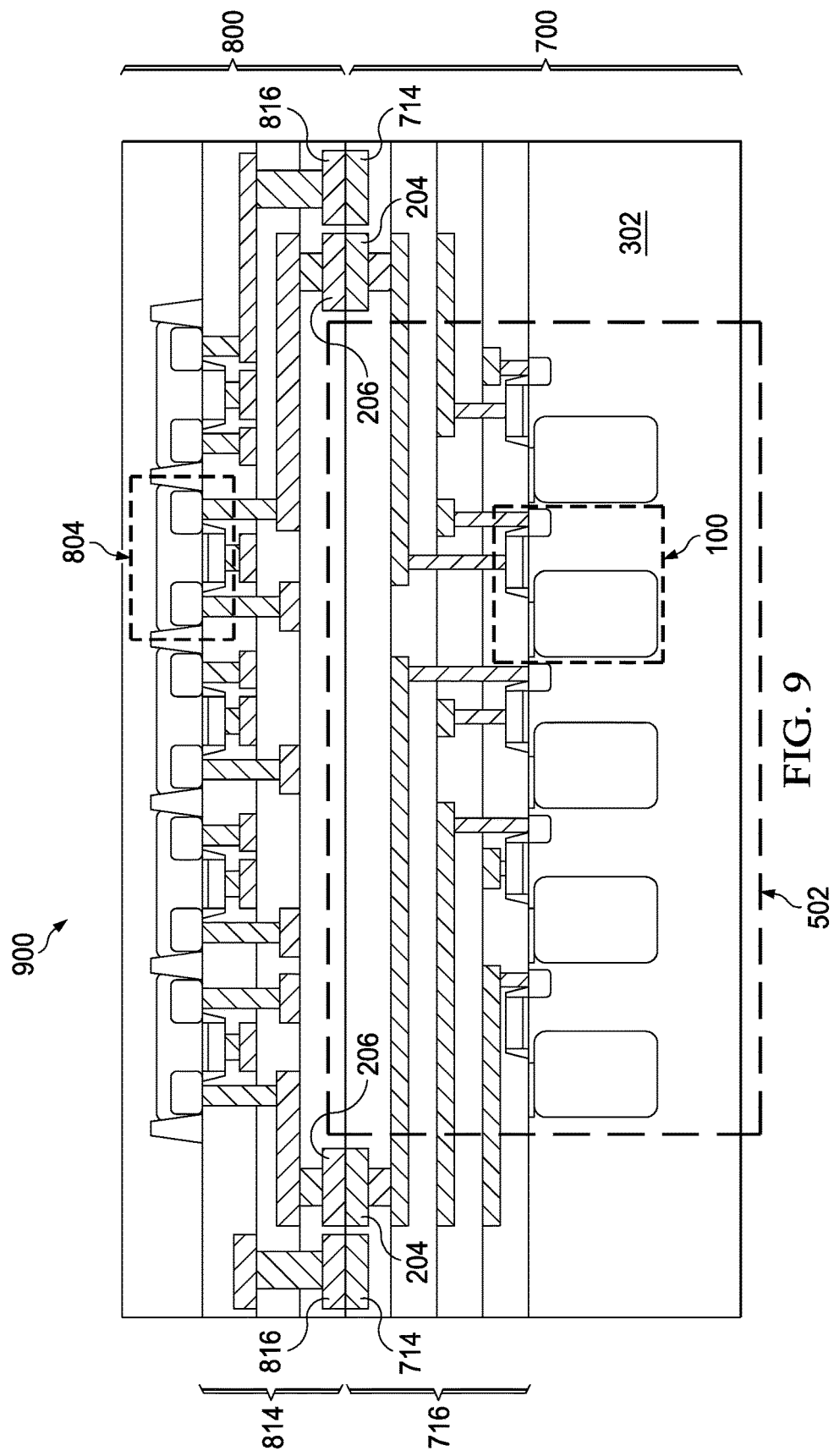

FIG. 9 is a cross-sectional view illustrating bonding the sensor die 700 and a control circuit die 800. In an embodiment, the control circuit die 800 is bonded to the sensor die 700 to form a stacked structure 900 and so that the sensor bond pads 204 are in electrical contact with the control circuit bond pads 206, permitting devices on the control circuit die 800 such as a control circuit transistor 804 to access or control the pixels 100 on the sensor die 700.

Various bonding techniques may be employed to achieve bonding between the sensor die 700 and the control circuit die 800. In accordance with an embodiment, suitable bonding techniques may include direct bonding, hybrid bonding and the like.

Figure 14:
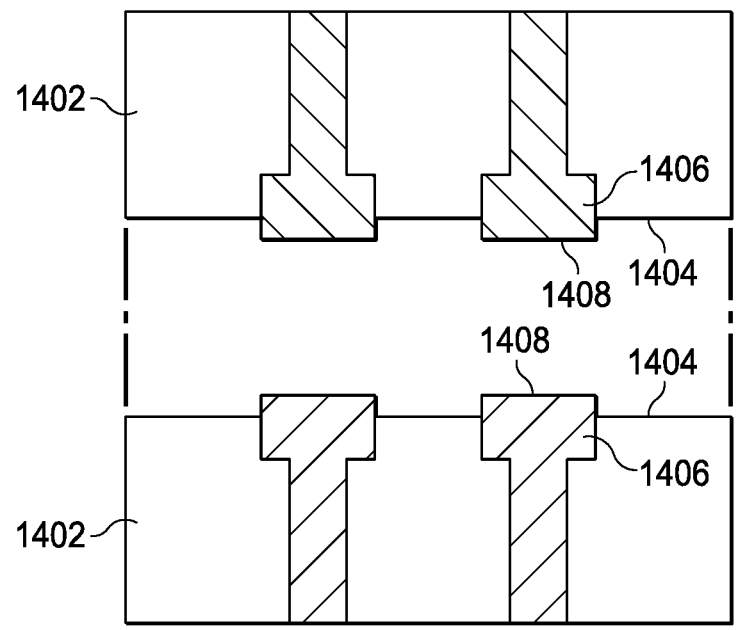
FIGS. 14-17 are cross-sectional views of bond pad structures according to various embodiments.
Figure 15:
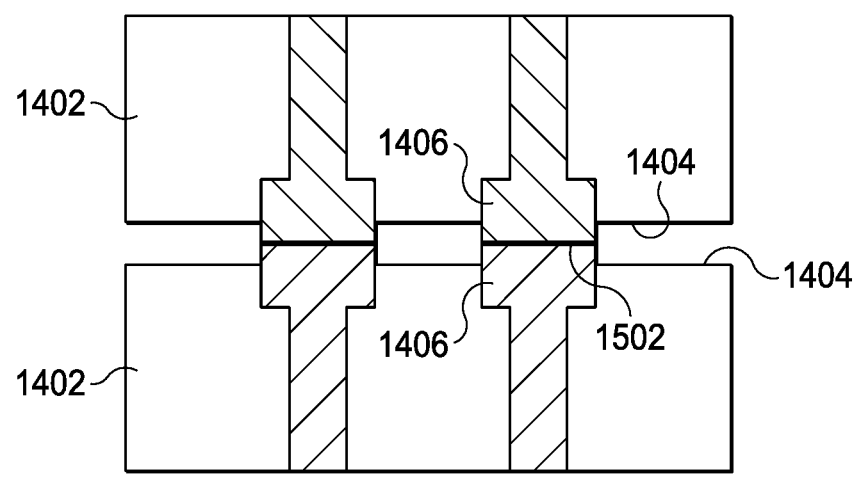

FIGS. 14 and 15 illustrate metal-to-metal bonding where the bond pads 1406 are compressed under heat to fuse the metals and form a bond. In an embodiment, a thermo-compression process may be performed on dies 1402. Such a thermo-compression process leads to metal inter-diffusion. In an embodiment, the bond pads 1406 (204 and 206 of FIG. 9) are copper and the copper atoms of the bond pads surfaces 1406 may acquire enough energy to diffuse between adjacent bonding pads. As a result, a homogeneous copper interface 1502 is formed between two bonding pads 1406. Such a homogeneous copper interface 1502 helps the bond pads 1406 (204 and 206 of FIG. 9) form a uniform bonded feature. In addition, the uniform bonded feature also provides a mechanical bond to hold the sensor die 700 to the control circuit die 800. In an embodiment, the bond pads surfaces 1408 may be raised above the respective die surfaces 1404 to ensure good metal-to-metal contact between the bond pads 1406 (204 and 206 of FIG. 9). In such an embodiment, the bond pads 1406 (204 and 206 of FIG. 9) may be fused by metal-to-metal contact, and the dies 1402 or RDLs 716 and 814 spaced apart. In other embodiment, the bond pad surface 1408 may be about level with the die surfaces 1404. Additionally, an underfilling or adhesive (not shown) may be formed between the RDLs 716 and 814 where such spacing occurs.

Figure 16:
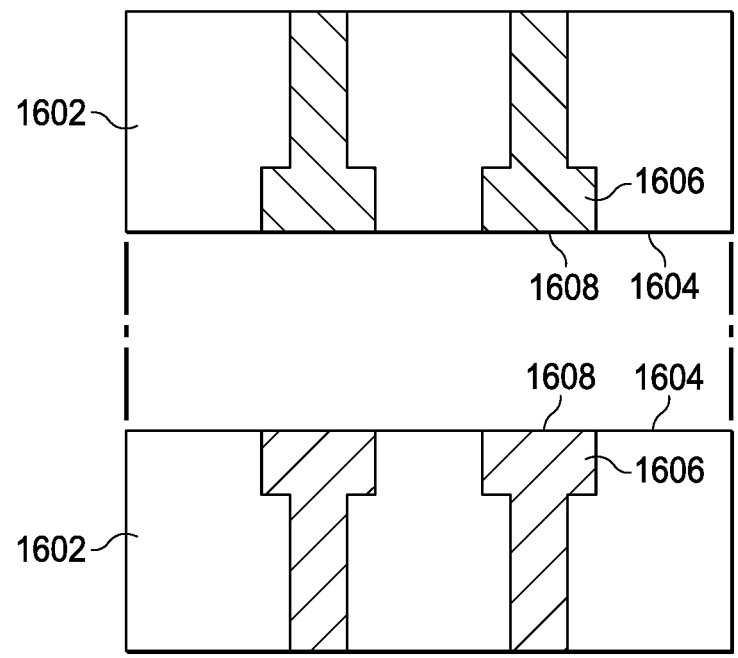
Figure 17:
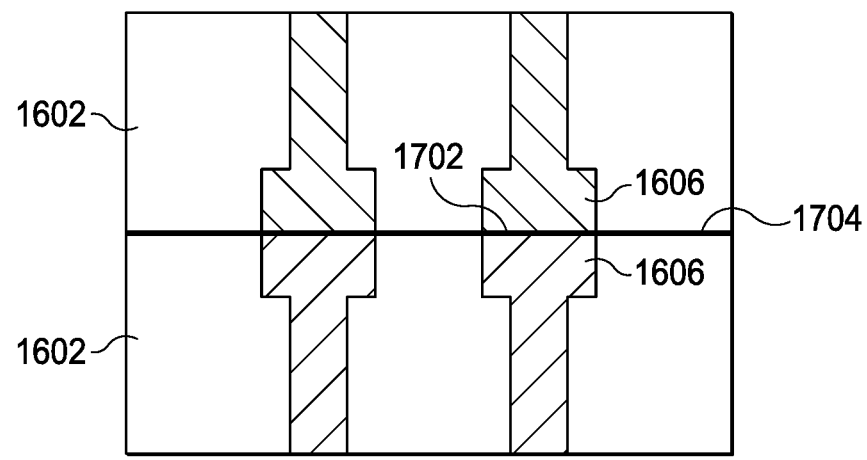

In an embodiment, the sensor die 700 and the control circuit die 800 may also be bonded together using a suitable wafer bonding technique. FIGS. 16-17 illustrate wafer surface direct bonding or hybrid according to embodiments. In direct wafer surface bonding, dies 1602 are brought together, and the die surfaces 1604 of the dies bonded. In an embodiment, the die surfaces 1604 themselves are bonded without an intermediate bonding layer through, for example, fusion boding of silicon, silicon germanium, gallium arsenide, or another semiconductor material. In another embodiment, a bonding layer such as a native oxide, deposited oxide, thermal oxide, nitride, or the like, is formed on the die surfaces 1604. The die surfaces 1604 may be bonded together using chemical treatment or pressure and heat at the die surfaces 1604 to form a bond by interdiffusion of the die surface or by formation of covalent bonds between atomic structures of the dies 1602. Direct wafer surface bonding holds the bond pads 1606 in contact with each other.

In another embodiment, one or more bond pads 1606 may be formed after bonding the die surfaces 1604 using direct wafer surface bonding, for example, by oxide-to-oxide bonding. In such an embodiment, bond pads 1606 are part of a connected via and may have a width substantially the same as a connected via, or may have a width greater than a connected via. The bond pads 1606 on one wafer may be formed prior to bonding, and the bond pads 1606 on the second wafer created after bonding. For example, bond pads may be formed in a control circuit die and one or more bond pads may be omitted from the sensor die. The control circuit die may then be bonded to the sensor die. The combined structure may be further processed, by, for example, thinning the back, non-bonded side of the sensor die. The sensor die may then be etched, by for example, plasma etching or the like. The sensor die may be etched from the back side until a via opening is created through the sensor die, exposing the bond pad or another metal layer on the control circuit die. The etching may form the opening to the bond interface, through the bond interface into the control circuit die, or to a previously formed feature in the sensor die. After forming the opening, a conductive structure, such as copper, gold, aluminum, alloys of the same, or a like material may be formed in the via opening by a process such as chemical vapor deposition, physical vapor deposition, electroplating, or the like.

In an embodiment, direct bonding is achieved through, for example, oxide-to-oxide, dielectric-to-dielectric, or substrate-to-substrate bonding or by bonding any combination of substrate, semiconductor or dielectric bonding by washing the die surfaces 1604 with an RCA clean with distilled water and hydrogen peroxide ($H_2O_2$) combined with ammonium hydroxide ($NH_4OH$) or hydrochloric acid (HCl). In an embodiment, the die surfaces 1604 are plasma activated with, for example, a reactive ion etch or a non-etching plasma treatment. The dies may be joined after cleaning and plasma activation and subsequently annealed at a relatively low temperature to bond the wafer surfaces at an atomic level.

In an embodiment, dies have RDLs 716 and 814 disposed thereon, and are directly bonded, for example, through an oxide-to-oxide or dielectric-to-dielectric bonding process. In such an embodiment, an anneal process is performed on the stacked semiconductor structure in a chamber with inert gases such as argon, nitrogen, helium and the like to bond the RDLs.

In an embodiment, hybrid bonding is performed using a combination of direct wafer surface bonding and metal-to-metal bonding. The die surfaces 1604 may be directly bonded and the bond pads 1606 may be subsequently bonded. For example, the wafer surfaces 1604 may be bonded using a direct wafer surface bonding such as an RCE clan and bond, followed by an anneal to fuse the metal bond pads 1606.

In an embodiment, where bond pads 1606 are held in contact with wafer direct bonding, the major material of the bond pads 1606 may be copper (Cu), aluminum-copper alloy (AlCu), tungsten (W), alloys of the same or the like. The metal plug or bond pad 1606 may have 2D pitch of about 0.5 µm to about 5 µm or in another embodiment, a pitch of about 5 µm or greater and may have a depth in the die 1602 about 0.2 µm or greater.

In an embodiment where bond pads 1606 are connected directly using metal-to-metal bonding or hybrid bonding with metal-to-metal bonding, the bond pad 1606 major material may be copper, ruthenium (Ru) or the like, with pad size greater than or equal to about 0.5 µm.

Referring again to FIG. 9, while the bonding process herein is described in terms of bonding a sensor die 700 to a control circuit die 800, the dies 700 and 800 may be bonded as part of a larger wafer bonding procedure. For example, a sensor wafer may include a plurality of sensor dies 700, and a control circuit wafer may include a plurality of control circuit dies 800. Fabricating the control circuit dies 800 separately from the sensor dies 700 may permit interchanging of dies to match specific applications or to upgrade one die 700 and 800 without requiring the complementary die to be refabricated. For example, a standardized sensor die 700 may have any number of different control circuits mounted thereon; with each control circuit die 800 having, for example, a different output format. In an embodiment, the sensor bond pads 204 have the same pitch and arrangement as the control circuit bond pads 206, so the bond pads 204 and 206 line up accurately when the dies 700 and 800 are bonded.

The wafer-to-wafer bonding may be performed on wafers having a substantially matched size. Additionally, in an embodiment, the sensor die 700 size and the control circuit die 800 size may be somewhat matched, with the sensor die 700 size being between about 80% and about 120% of the control circuit die 800 size. In one embodiment, buffer regions or dummy patterns may be added to each sensor die 700 or to each control circuit die 800 in a wafer to bring the die size into the predetermined size range comparable to the complementary die.

Additionally, the bonding of a sensor die 700 to the control circuit die 800 is not limited to a one-to-one bonding. In an embodiment, multiple dies may be attached to a single control circuit die 800, or multiple dies may be mounted on a sensor die 700. For example, a control circuit die 800 may have a sensor die 700 mounted thereon, and may also have additional dies such as communications dies, memory dies, additional processing dies, or the like mounted thereon. In another embodiment, a sensor die 700 may have a control chip die 800 and one or more additional dies such as a memory die, communications die, additional processor die or the like mounted thereon.

Figure 10:
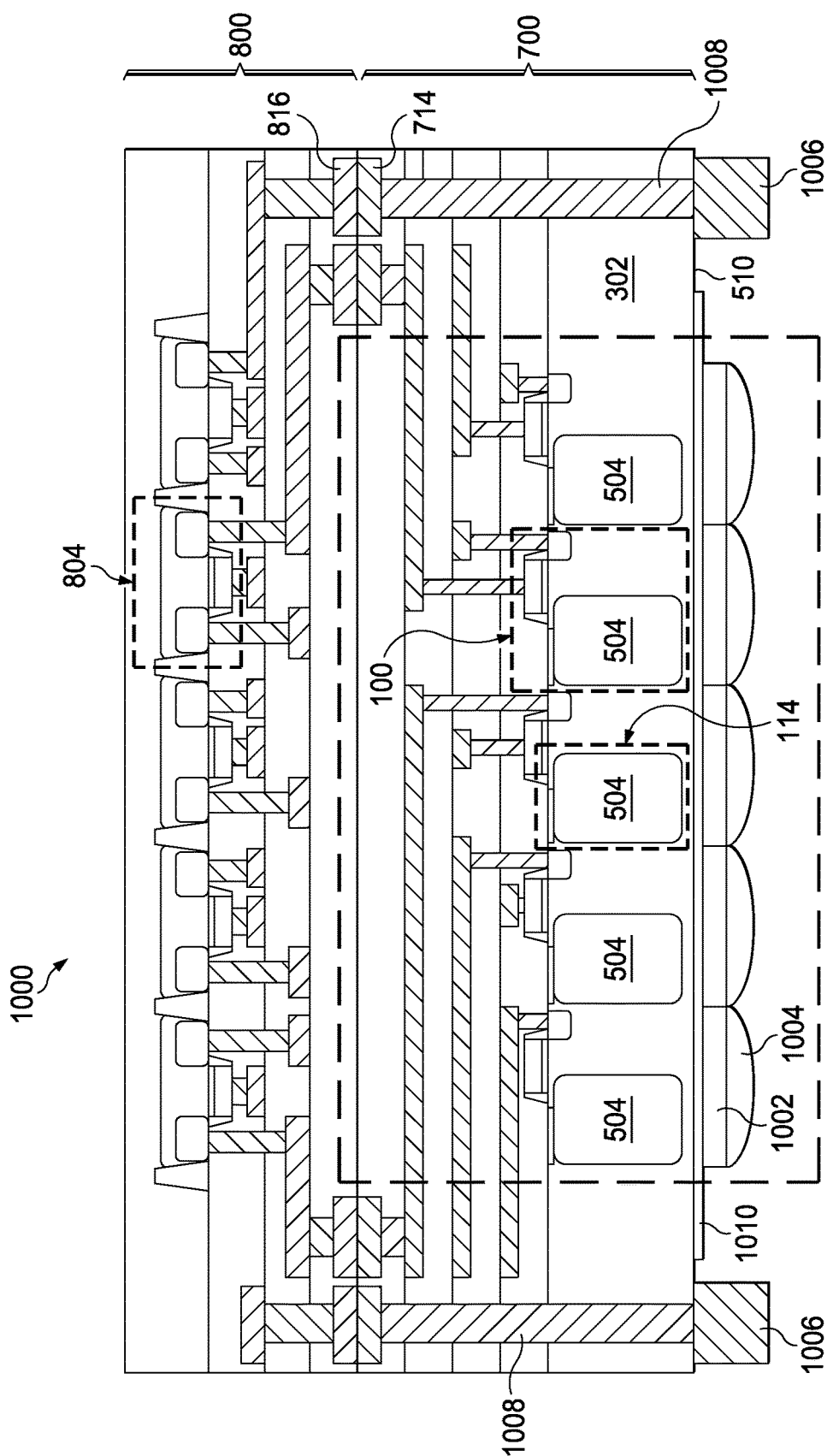

FIG. 10 is a cross sectional view of a sensor package 1000 with filters and lenses. The sensor die substrate 302 is thinned at the backside 510 until the sensor die substrate 302 reaches a predetermined thickness. Such a thinned sensor die substrate 302 allows light to pass through the substrate and hit the photosensitive regions 504 of the photodiodes 114 embedded in the sensor die substrate 302 with less absorption by the sensor die substrate 302.

In an embodiment, the thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the backside of the sensor die substrate 302 and a grinding pad (not shown) is used to grind away the backside of the sensor die substrate 302 until a desired thickness is achieved.

In an embodiment, an optical coating such as an antireflective coating 1010 may be applied to the backside 510 of the sensor package 1000. A color filter layer 1002 may be applied to the backside of the sensor die substrate 302 in accordance with an embodiment, or over the optical coating where used. The color filter layer 1002 may be used to allow specific wavelengths of light to pass while reflecting other wavelengths, thereby allowing the image sensor to determine the color of the light being received by the photosensitive region 504. The color filter layer 1002 may vary, such as a red, green, and blue filter. Other combinations, such as cyan, yellow, and magenta, or white, transparent or almost transparent may also be used. The number of different colors of the color filters 1002 may also vary.

In accordance with an embodiment, the color filter layer 1002 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 1002. Other materials, however, may be used. The color filter layer 1002 may be formed by another suitable method known in the art.

A microlens layer 1004 may be applied in accordance with an embodiment. The microlens layer 1004 may be formed of any material that may be patterned and formed into lenses, such as a high transmittance, acrylic polymer. In an embodiment, the microlens layer 1004 is about 0.1 μm to about 2.5 μm thick. The microlens layer 1004 may be formed using a material in a liquid state and spin-on techniques known in the art. In an embodiment, the spun on layer is cut to form individual lenses and then reflowed to permit the in cut portions of the spun-on layer to form curved surfaces of individual lenses. This method has been found to produce a microlens layer 1004 having a substantially uniform thickness, thereby providing greater uniformity in the microlenses. Other methods, such as deposition techniques like chemical vapor deposition (CVD), physical vapor deposition (PVD), or the like, may also be used.

One or more mounting pads 1006 and mounting vias 1008 may also be formed on the sensor package 1000. The mounting vias 1008 may electrically connect a mounting pad 1006 to a package bond pad 714, permitting one or more control circuit transistors 804 to communicate with an external device when the sensor package 1000 is mounted.

Figure 11:
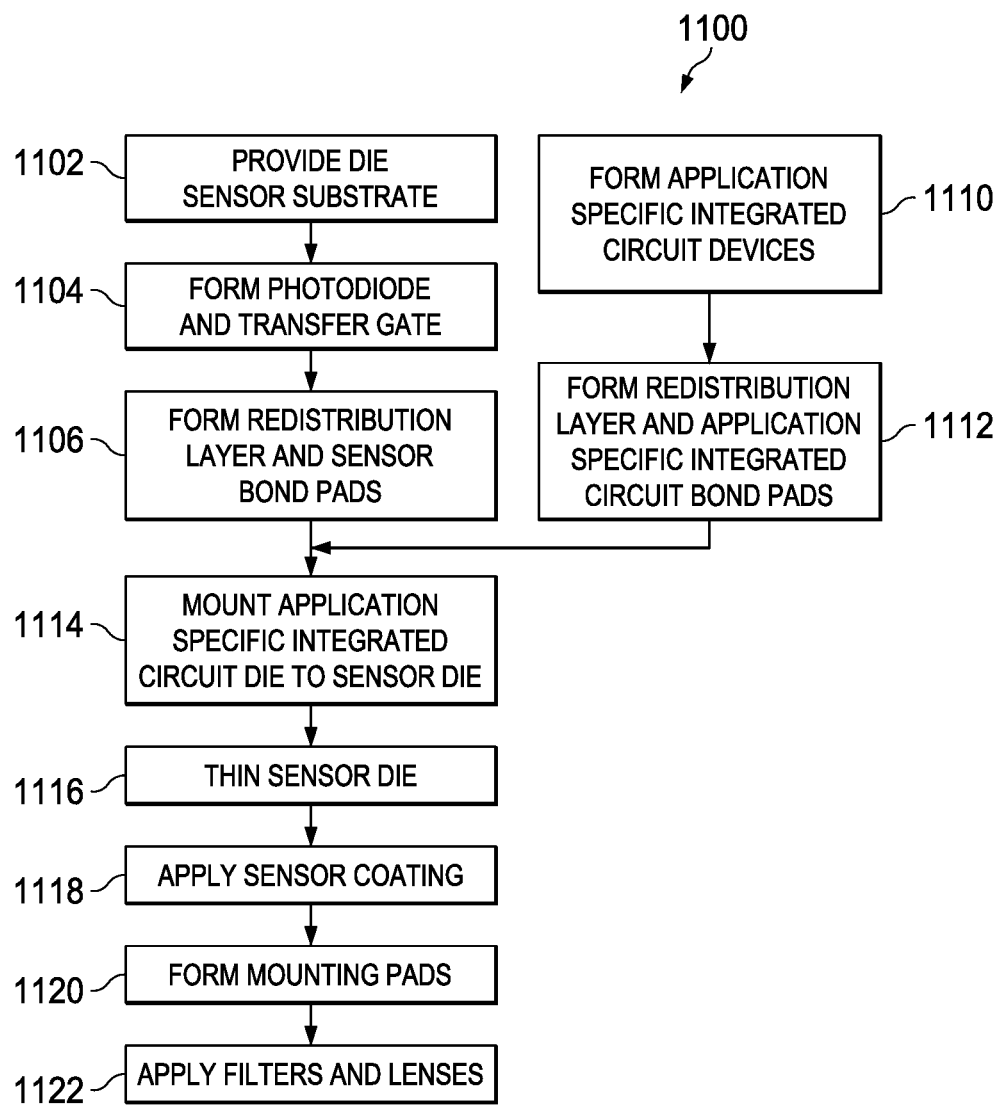
FIG. 11 is a flow chart of a method for forming an image sensor device in accordance with an embodiment.

FIG. 11 is a flow diagram illustrating a method 1100 of forming a sensor package 1000. A sensor die substrate 302 may be provided in block 1102 and the photodiode 114, transfer gate 602 and drain 506 formed on the sensor die substrate 302 in block 1104. A sensor region 502 may be defined, with the pixels 100 inside the sensor region 502. An RDL layer 716 and sensor bond pads 204 may be formed in block 1106. A control circuit die 800 may be fabricated with control circuit devices 804 formed in block 1110 and an RDL 814 and control circuit bond pads 206 formed in block 1112. The control circuit formation steps of block 1110 and 1112 may be performed separately from, and without dependency on, the sensor formation steps of block 1102, 1104 and 1106.

The control circuit die 800 may be mounted on the sensor die 700 in block 1114. The sensor die substrate 302 may be thinned in block 1116, and an optical coating such as an antireflective coating 1010 applied in block 1118. Mounting pads 1006 and any associated mounting vias 1008 may be formed in block 1120. Filters and lenses such as color filter layers 1002 and microlenses 1004 may be applied in block 1122.

Figure 12:
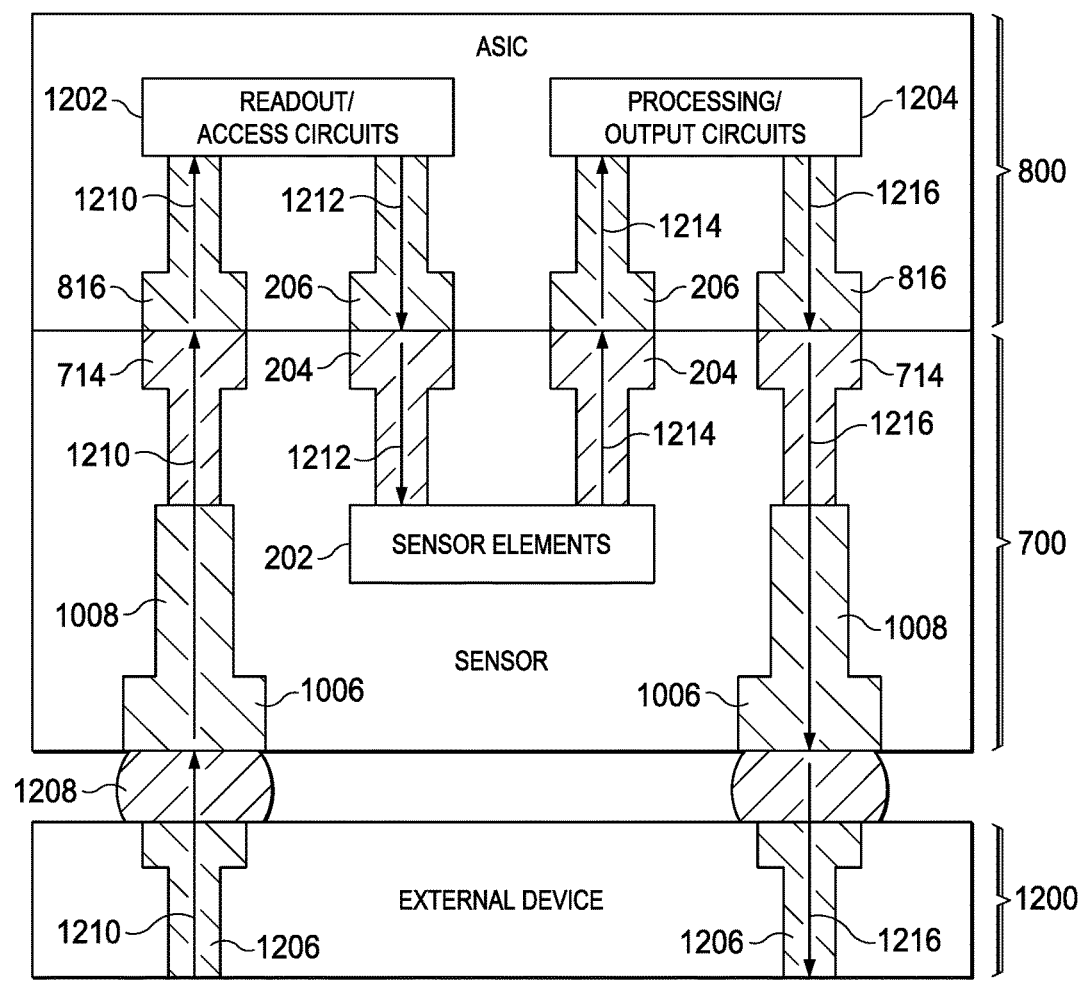
FIGS. 12-13 are diagrams illustrating signal communication through various image sensor and control circuit dies according to mounting arrangement embodiments.
Figure 13:
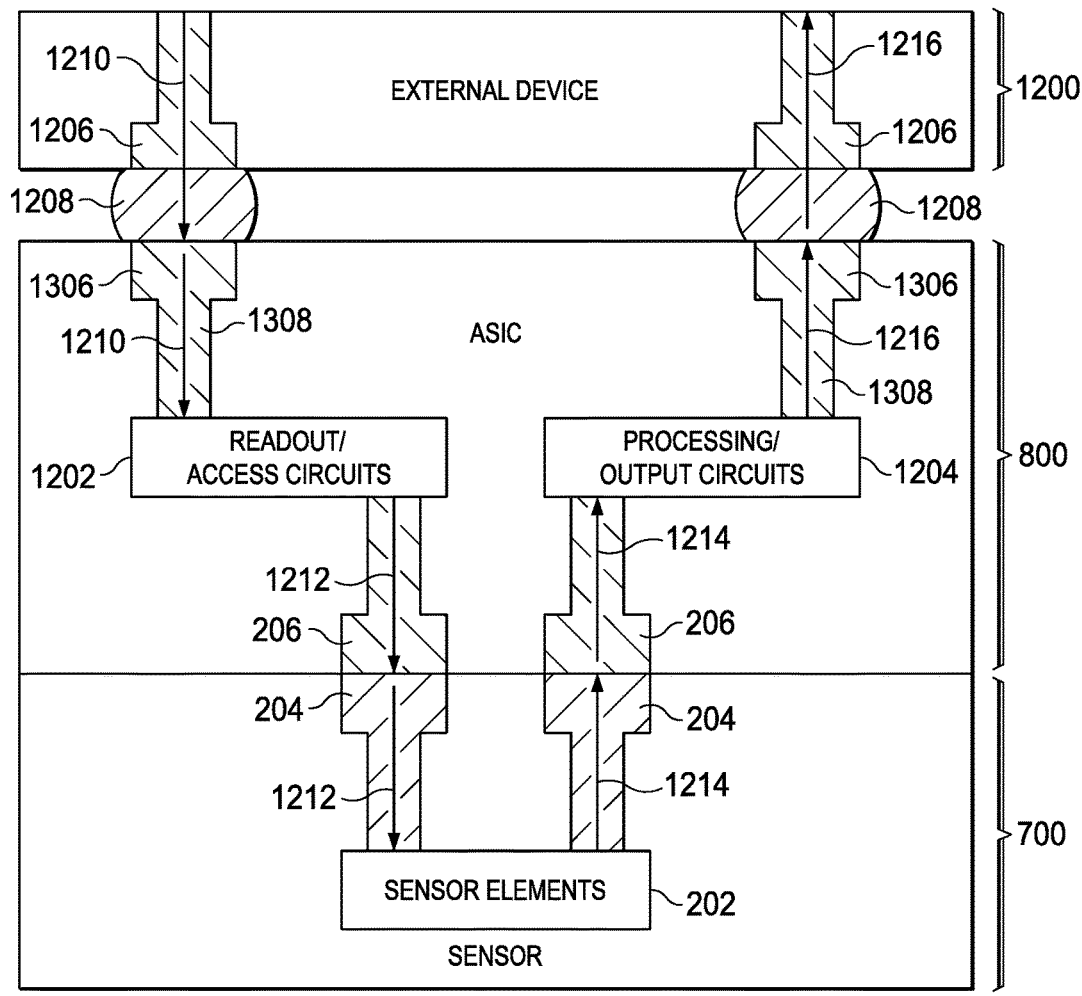

FIGS. 12 and 13 illustrate embodiments of a sensor die 700 and control circuit die 800 bonded together and the circuit flow through the dies. A front mounted chip arrangement, as shown in FIG. 12, may have mounting pads 1006 disposed on the sensor die 700. An outer signal such as an input signal 1210 may move through the sensor die 700 and be handled by the ASIC or control circuit die 800, which may then address or control circuit elements on the sensor die 700 by way of a control signal 1212. A data signal 1214 from the sensor die 700 may move from the sensor die 700 into the control circuit die 800 before being processed by the processing or output circuit 1204. In an embodiment, the control signal and the data signal 1214 may be transmitted over separate electrical connections, for example, by using dedicated lines.

An outer signal may then be transmitted back through the sensor die 700 through the mounting pads 1006 as an output signal 1216. Furthermore, outer signals such as the input signal 1210 or the output signal 1216 can connect through the mounting pad 1006 on the sensor die 700 to an external device by a connector 1208 such as wire bond, via, plug, gold stud bump, solder ball or the like. The external device may be a substrate, a die, a PCB, a package, a device, or the like.

The sensor die 700 and control circuit die 800 may be bonded together using one of, or a combination of, direct bonding, hybrid bonding or metal-to-metal bonding. For example, the package bond pads 714 and 816 may be bonded using a first bond technique, such as direct wafer surface bonding, hybrid bonding or metal-to-metal bonding. The sensor bond pads 204 may be bonded together with control circuit bond pads 206 using a second bond technique, such as direct wafer surface bonding, hybrid bonding or metal-to-metal bonding, and the second bond technique may be the same or different than the first bond technique. Different bond techniques may be implemented by, for example, using bond pads of different materials so that one set of bond pads fuses during an anneal, while the second set of bond pads does not fuse during the anneal.

In an embodiment, an outer signal such as an input signal 1210 may be transmitted from an external device 1200 through a connector 1208 to a mounting pad 1006 on the sensor die 700. The input signal 1210 may, for example, be a command to read the sensor data such as capturing an image. The input signal 1210 is then transmitted to a control circuit such as a readout or access circuit 1202 on control circuit die 800 though the package bond pads 714 and 816 joint by the first bond technique. The access circuit 1202 may generate a control signal 1212, such as, for example, a row and column access command, a reset comment, or the like. The control signal 1212 is transmitted to the sensor 202 on the sensor die 700 through the sensor bond pads 204 and control circuit bond pads 206 joined with a second bond technique. A data signal 1214 may be transmitted from the sensor 202 on the sensor die 700 to a processing or output circuit 1204 through the sensor bond pads 204 and control circuit bond pads 206 joined with a second bond technique. The data signal 1214 may, for example, be sensor data such as a portion of an image collected from the sensor 202 in response to the command signal 1212 sent to the sensor 202. An output signal 1216 may be transmitted by the processing and output circuits 1204 to an external device 1200 through a connector 1208 formed from a back-end-of-line metal forming process such as a stud, via, solder ball, land grid array (LGA) or the like.

In a back mounting arrangement as shown in FIG. 13, mounting pads 1306 may be on the control circuit die 800. An outer signal such as an input signal 1210 may enter the control circuit die 800 from an external device 1200 through a connector 1208 such as a via, solder ball, LGA, wire, or the like. The readout or access circuit 1202 may address or control the sensor 202 with a control signal 1212. The processing and output circuits 1204 may then receive data from the sensor die and transmit the data back out though the mounting pads 1306. An output signal 1216 may be transmitted by the processing and output circuits 1204 to an external device 1200 through a connector 1208 formed from a back-end-of-line metal forming process such as a stud, via, solder ball, land grid array (LGA) or the like. The external device may be a substrate, a die, a PCB, a package, a device, or the like.

The sensor die 700 and control circuit die 800 can be bonded together with the control circuit bond pads 206 and sensor bond pads 204 held in contact by hybrid bonding, direct wafer bonding or metal-to-metal bonding. An output signal 1216 may be transmitted by the processing and output circuits 1204 to an external device 1200 through a connector 1208 formed from a back-end-of-line metal forming process or a stud, via, solder ball, land grid array (LGA) or the like.

Embodiments of the devices presented herein provide arrangements permitting mounting of bonded dies with input signals entering the device through the mounted side of the device and control circuits in one die communicating with a sensor in a second die of the device. An output signal is transmitted by the control circuit through the mounted side of the device. Additionally, the embodiments described herein provide a system and method for forming a device by bonding a sensor die to a control circuit die with one or more bonding methods such as direct surface wafer bonding, hybrid bonding or metal-to-metal bonding. Providing a sensor on a die separate from the control circuit die permits structures of the sensor die to be formed from different transistor types than those of the control circuits. Furthermore, the dies being bonded using a variety of bonding techniques may provide greater bonding strength while improving reliability.

Therefore, according to an embodiment, a device has a sensor die with a sensor and a control circuit die with at least one control circuit disposed therein, the control circuit die on the sensor die. A plurality of mounting pads is disposed on a second side of the sensor die. A first electrical connection connects a first one of the plurality of mounting pads to a first control circuit of the at least one sensor control circuit and a second electrical connection connects the first control circuit to the sensor. A third electrical connection connects the sensor to a second control circuit of the at least one control circuit and a fourth electrical connection connects the second control circuit to second one of the plurality of mounting pads.

The first control circuit is configured to receive an input signal from the mounting pads through the first electrical connection, and wherein the at least one sensor control circuit is configured to transmit a control signal over the second electrical connection to the sensor. The first control circuit may be a readout circuit or an access circuit. The second control circuit is configured to receive a data signal from the sensor through the third electrical connection, and wherein the at least one sensor control circuit is configured to transmit an output signal over the fourth electrical connection to the sensor. The second control circuit may be a processing circuit or an access circuit. The first control circuit is configured to receive an input signal from an external device through the mounting pads, and wherein the second control circuit is configured to transmit an output signal to the external device through the mounting pads.

The first electrical connection and the fourth electrical connection may have first bond pads disposed in the sensor die and second bond pads disposed in control circuit die, the first bond pads and second bond pads in electrical contact and bonded with a first bonding method. The second electrical connection and the third electrical connection may have third bond pads disposed in the sensor die and fourth bond pads disposed in control circuit die, the third bond pads and fourth bond pads in electrical contact and bonded with a second bonding method. The first bonding method and the second bonding are each selected from hybrid bonding and direct surface bonding. In an embodiment, the first bonding method is different from the second bonding method, and in another embodiment, the first bonding method is the same as the second bonding method.

A device according to another embodiment comprises a pixel array disposed in a sensor die and configured to sense light though a back side of the sensor die. Mounting pads are disposed in a control circuit die and a first control circuit is disposed on the control circuit die, the control circuit die bonded to a front side of the sensor die. The first sensor control circuit is electrically connected to the first contact pad and configured to receive an input signal from the first contact pad. A second control circuit is disposed on the control circuit die, and is electrically connected to the second contact pad and configured to transmit an output signal though the first contact pad. A first electrical connection connects the first control circuit to the pixel array, and is configured to send a control signal to the pixel array over the first electrical connection. A second electrical connection connects the second control circuit to the pixel array, and is configured to receive a data signal from the pixel array over the first electrical connection.

The first contact pad and the second contact pad are configured to be connected to a through via that is external to the device. The first control circuit is a readout or access circuit, and the second control circuit is a processing or output circuit. The first electrical connection and the fourth electrical connection comprise first bond pads disposed in the sensor die and second bond pads disposed in control circuit die, with the first bond pads and second bond pads in electrical contact. The control circuit die and the sensor die are bonded using hybrid bonding or direct surface bonding.

A method of forming a device according to an embodiment comprises forming a plurality of mounting pads at a first surface of the sensor die having a sensor disposed therein. First metal elements are formed in the sensor die, the first metal elements having first bond pads disposed at a second surface of the sensor die, and the first metal elements electrically connecting the first bond pads to the plurality of mounting pads. Second metal elements are formed in the sensor die, the second metal elements having second bond pads disposed at a second surface of the sensor die, and the second metal elements electrically connecting the second bond pads to the sensor. Third metal elements and fourth of metal elements are formed in a control circuit die having at least one control circuit disposed therein, the third metal elements having first control circuit bond pads disposed at a surface of the control circuit die, the fourth metal elements having second control circuit bond pads disposed at a surface of the control circuit die. The third metal elements electrically connect the first control circuit bond pads to the at least one sensor control circuit, and the fourth metal elements electrically connect the second control circuit bond pads to the at least one sensor control circuit. The surface of the control circuit die is bonded to the sensor die, with the first bond pads in contact with the first control circuit bond pads, and the second bond pads in contact with the second control circuit bond pads. The bonding comprises bonding the control circuit die to the sensor die using hybrid bonding or direct surface bonding. A first control circuit of the at least one control circuit is a readout circuit or access circuit and a second control circuit of the at least one control circuit is a processing circuit or output circuit. The first control circuit is configured to receive an input signal from the mounting pads through a first portion of the first metal elements and the second control circuit is configured to transmit an output signal to the mounting pads through a second portion of the first metal elements. The first control circuit is configured to transmit a control signal to the sensor through a first portion of the second metal elements and the second control circuit is configured to receive a signal from the pixel array through a second portion of the second metal elements.

One general aspect of embodiments disclosed herein includes a device including a pixel array disposed in a sensor die and configured to sense light though a back side of the sensor die; mounting pads disposed in a control circuit die; a first control circuit disposed on the control circuit die, the control circuit die bonded to a front side of the sensor die, the first control circuit electrically connected to at least one of the mounting pads and configured to receive an input signal from at least one of the mounting pads; a second control circuit disposed on the control circuit die, the second control circuit electrically connected to at least one of the mounting pads and configured to transmit an output signal through at least one of the mounting pads; a first electrical connection connecting the first control circuit to the pixel array, where the first control circuit is configured to send a control signal to the pixel array over the first electrical connection; anda second electrical connection connecting the second control circuit to the pixel array, where the second control circuit is configured to receive a data signal from the pixel array over the first electrical connection.

Another general aspect of embodiments disclosed herein includes a device including a sensor die having a front surface and a back surface, the sensor die having a pixel array formed at the front surface thereof; an electrical interconnect structure formed over the front surface of the sensor die, the electrical interconnect structure including a first subset of contact pads and a second subset of contact pads, the first subset of contact pads being electrically connected to the pixel array; a control die mounted over the front side of the sensor die, the control die including a first control circuit having a first control output electrically connected to a first control die contact pad, the first control die contact pad being connected to a first one of the first subset of contact pads, a second control circuit having a second control output electrically connected to a second control die contact pad, the second control die contact pad being connected to a second one of the first subset of contact pads, and an array of microlenses formed on the back surface of the sensor die.

Yet another general aspect of embodiments disclosed herein includes a method including forming on a sensor die a pixel array on the front side of the sensor die, a first contact pad on the front side of the sensor die and being electrically connected to a signal input of the pixel array and a second contact pad on the front side of the sensor die and being electrically connected to an output of the pixel array, and positioning above the sensor die a control circuit die having on its front side a third contact pad electrically connected to an output of a first control circuit, a fourth contact pad electrically connected to an input of a second control circuit, a fifth contact pad electrically connected to an input of the first control circuit, and a sixth contact pad electrically connected to an output of the second control circuit, aligning the first contact pad to the third contact pad and the second contact pad to the fourth contact pad; and bonding the front side of the sensor die to the front side of the control circuit die.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a pixel array disposed in a sensor die and configured to sense light though a back side of the sensor die;
mounting pads disposed in a control circuit die;
a first control circuit disposed on the control circuit die, the control circuit die bonded to a front side of the sensor die, the first control circuit electrically connected to at least one of the mounting pads and configured to receive an input signal from at least one of the mounting pads;
a second control circuit disposed on the control circuit die, the second control circuit electrically connected to at least one of the mounting pads and configured to transmit an output signal through at least one of the mounting pads;

a first electrical connection connecting the first control circuit to the pixel array, wherein the first control circuit is configured to send a control signal to the pixel array over the first electrical connection; and a second electrical connection connecting the second control circuit to the pixel array, wherein the second control circuit is configured to receive a data signal from the pixel array over the first electrical connection.

2. The device of claim 1, wherein a second one of the mounting pads is connected by a connector to a through via that is external to the device.

3. The device of claim 1, wherein the first control circuit is a readout or access circuit, and wherein the second control circuit is a processing or output circuit.

4. The device of claim 1, wherein the first electrical connection comprises first bond pad disposed in the sensor die and a second bond pad disposed in the control circuit die, and wherein the first bond pad and second bond pad are in electrical contact.

5. The device of claim 1, wherein the control circuit die and the sensor die are bonded using hybrid bonding or direct surface bonding.

6. The device of claim 1, wherein the second electrical connection includes a transfer line connected to multiple pixels of the pixel array.

7. The device of claim 1, wherein the pixel array is a two-dimensional 5*5 array of pixels.

8. The device of claim 1, wherein the second control circuit comprises a processing circuit or an access circuit.

9. The device of claim 1, further comprising a microlens layer disposed on a second side of the sensor die.

10. A device comprising:
a sensor die having a front surface and a back surface, the sensor die having a pixel array formed at the front surface thereof;
an electrical interconnect structure formed over the front surface of the sensor die, the electrical interconnect structure including a first subset of contact pads and a second subset of contact pads, the first subset of contact pads being electrically connected to the pixel array;
a control die mounted over the front side of the sensor die, the control die including
a first control circuit having a first control output electrically connected to a first control die contact pad, the first control die contact pad being connected to a first one of the first subset of contact pads,
a second control circuit having a second control output electrically connected to a second control die contact pad, the second control die contact pad being connected to a second one of the first subset of contact pads, and
an array of microlenses formed on the back surface of the sensor die.

11. The device of claim 10, further comprising a first through via passing through the sensor die and electrically connecting the first control circuit to a first external connector on the back side of the sensor die, and a second through via passing through the sensor die and electrically connecting the second control circuit to a second external connector on the back side of the sensor die.

12. The device of claim 10, wherein the pixel array is formed in a central region of the front surface of the sensor die and the first subset of contact pads and second subset of contact pads are formed in a peripheral region of the front surface of the sensor die surrounding the central region of the front surface of the sensor die.

13. The device of claim 10, wherein the first control die contact pad being is bonded to the first one of the first subset of contact pads.

14. The device of claim 11, further comprising an external device mounted to the back side of the sensor die.

15. The device of claim 14, wherein the first control circuit is configured to receive a control signal from the external device through the first through via and the second control circuit is configured to transmit a data signal to the external device through the second through via.

16. The device of claim 10, wherein the first control circuit comprises a readout circuit or an access circuit.

17. The device of claim 10, wherein the second control circuit comprises a processing circuit or an access circuit.

18. A method comprising:
forming on a sensor die
a pixel array on the front side of the sensor die,
a first contact pad on the front side of the sensor die and being electrically connected to a signal input of the pixel array and a second contact pad on the front side of the sensor die and being electrically connected to an output of the pixel array, and
positioning above the sensor die a control circuit die having on its front side
a third contact pad electrically connected to an output of a first control circuit, a fourth contact pad electrically connected to an input of a second control circuit, a fifth contact pad electrically connected to an input of the first control circuit, and a sixth contact pad electrically connected to an output of the second control circuit,
aligning the first contact pad to the third contact pad and the second contact pad to the fourth contact pad; and
bonding the front side of the sensor die to the front side of the control circuit die.

19. The method of claim 18 further comprising mounting an external device to a back side of the sensor die and electrically connecting the external device to the control circuit die using conductive elements passing through the sensor die.

20. The method of claim 18 further comprising mounting an external device to a back side of the control circuit die.

* * * * *

UNITED STATES PATENT AND TRADEMARK OFFICE
CERTIFICATE OF CORRECTION

PATENT NO. : 9,966,405 B2  
APPLICATION NO. : 15/132068  
DATED : May 8, 2018  
INVENTOR(S) : Tzu-Hsuan Hsu Page 1 of 1

It is certified that error appears in the above-identified patent and that said Letters Patent is hereby corrected as shown below:

In the Claims

In Column 14, Line 55, Claim 1, delete "though" and insert --through--.

Signed and Sealed this  
Seventeenth Day of July, 2018

Andrei Iancu  
*Director of the United States Patent and Trademark Office*